United States Patent
Romero et al.

(10) Patent No.: US 7,401,164 B2
(45) Date of Patent: Jul. 15, 2008

(54) METHODOLOGY FOR PERFORMING REGISTER READ/WRITES TO TWO OR MORE EXPANDERS WITH A COMMON TEST PORT

(75) Inventors: Gabriel L. Romero, Colorado Springs, CO (US); Jeffrey Gauvin, Colorado Springs, CO (US)

(73) Assignee: LSI Corporation, Milpitas, CA (US)

( * ) Notice: Subject to any disclaimer, the term of this patent is extended or adjusted under 35 U.S.C. 154(b) by 534 days.

(21) Appl. No.: 10/718,286

(22) Filed: Nov. 19, 2003

(65) Prior Publication Data

US 2005/0108602 A1 May 19, 2005

(51) Int. Cl.
*G06F 3/00* (2006.01)
(52) U.S. Cl. ..................................... 710/14
(58) Field of Classification Search .................. 710/14, 710/30, 61; 714/727
See application file for complete search history.

(56) References Cited

U.S. PATENT DOCUMENTS

2005/0120269 A1* 6/2005 Larson et al. .................. 714/29

OTHER PUBLICATIONS

CYGNAL Application Note, Programming FLASH through the JTAG Interface, Jul. 2002.*
IEEE Std 1149.1-2001 (Revision of IEEE Std 1149.1-1990), IEEE Standard Test Access Port and Boundary-Scan Architecture, Jul. 21, 2001.*
IEEE Std. 1149.1-2001 (Revision of IEEE 1149.1-1990), IEEE Standard Test Access Port and Boundary Scan Architecture, Jul. 21, 2001: pp. 1-24 and 36-67.*

* cited by examiner

*Primary Examiner*—Tammara Peyton
*Assistant Examiner*—Jasjit Vidwan
(74) *Attorney, Agent, or Firm*—Cochran Freund & Young LLC

(57) ABSTRACT

Disclosed is a process for controlling the expander cores of a dual expander using a single test port, such as a J-tag port. Access to and control of each expander core is accomplished by placing one of the cores in a bypass mode and accessing and controlling the other core through data supplied serially through the J-tag port.

18 Claims, 6 Drawing Sheets

PROCESS FOR PERFORMING A REGISTER WRITE OPERATION TO A SECOND EXPANDER CORE

METHODOLOGY FOR PERFORMING REGISTER READ/WRITES TO TWO OR MORE EXPANDERS WITH A COMMON TEST PORT

BACKGROUND OF THE INVENTION a. Field of the Invention

The present invention pertains generally to integrated circuit technology and more particularly to the control of expanders.

b. Description of the Background

Expanders have been used to control the pulse shape, slew rate and timing of signals, such as SCSI signals, in computer systems. Expanders operate similarly to repeaters, but are capable of correcting the deleterious effects of impedance and delays that a system may have on pulse waveforms so as to greatly improve the operation of such systems. Expanders are capable of modifying pulse shape, slew rate and timing by using delay circuits, pulse shaping circuits and other technology. In this fashion, expanders have found great utility.

An optimal way of controlling an expander is to connect the expander directly to a host bus in the computer system and provide operational parameters from the host for operating the expander to provide the proper corrective factors at various places in a system. Some circuits are so complex that several expanders may be needed to provide the proper corrections. Since the host bus, which provides a communication channel for controlling various components in a system, only has a certain number of addresses to connect to these components, and the number of components that need to be connected to the host bus is numerous, connection of several expanders to the host bus may use too many of these limited number of addresses. If the expanders are not connected to the host bus, there is no apparent way to control the expanders by the host during validation and debugging. Since adjustments frequently need to be made to the operation of the expanders, as a result of actual circuit conditions, control of the expanders is needed.

To overcome these limitations EEPROM devices have been built into the expanders to provide the control bits that function as operational parameters to instruct the expander to provide the necessary corrections, as desired. However, to make these corrections, the EEPROMs must be reprogrammed to change the operation of the expander so as to provide different corrections to the computer system signals. This normally requires that the EEPROM be physically removed from the expander board, reprogrammed and then reinserted back into the expander board. This process is very time consuming and may need to be repeated several times to produce the proper corrective effects in the computer system signals.

Hence, it would be advantageous to provide a method and device for controlling the operation of the expander in a simple and easy manner without using an address location on the host bus.

SUMMARY OF THE INVENTION

The present invention overcomes the disadvantages and limitations of the prior art by providing a system and method in which a test port, such as a J-Tag port, can be used to both read and write command codes to registers in the expander so as to control the operation of the expander in a simple and easy fashion. A single test port can be used to program dual expanders by putting one expander in bypass mode and programming the other expander.

The present invention may therefore comprise a process for controlling a multiple core expander comprising: using a test port or the dual expander to send operational codes to the dual expander to put all but one core, of the multiple core expander, in bypass mode; serially reading data from, and serially writing data to, at least one internal register of the one core through the test port.

The present invention may further comprise a method of controlling the operation of a dual expander having first and second expander cores by reading and writing control bits through a single test port in the dual expander comprising: placing one of the first and second expander cores in bypass mode; transmitting a serial data stream of the control bits through the test port to a shift register to generate a control byte; parallel shifting the control byte from the shift register to a control register in one of the first and second expander cores that is not in bypass mode; providing dummy bits as needed in the serial data stream to correctly form the control byte.

Advantages of the present invention include, but not by way of limitation or restriction of the scope of the claims, the ability to insert operational commands directly into the expander cores using a test port, such as a J-Tag port. Use of the test port eliminates the need to access the expander through the host bus. In addition, dual expander configurations can be controlled using a single test port by inserting control codes through the test port that put one of the expanders in bypass mode, while registers can be accessed in the other expander, that is not in bypass mode, through the test port. In this fashion, the operation of each of the expanders can be controlled through a single test port.

DETAILED DESCRIPTION OF THE DRAWINGS

Figure 1:
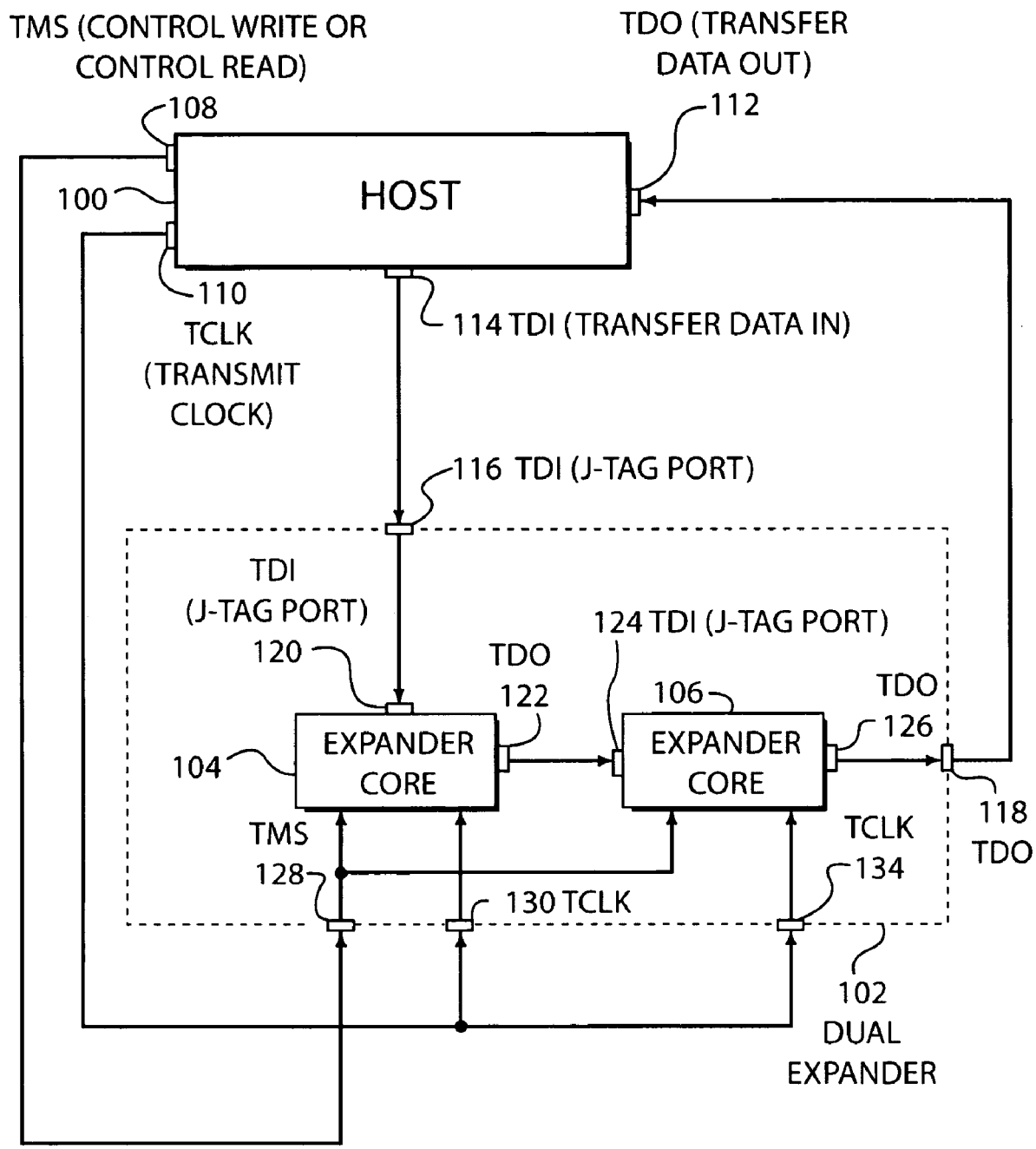
FIG. 1 is a schematic block diagram of a dual expander that is controlled by a host computer through a test port.

FIG. 1 is schematic block diagram illustrating a dual expander 102 that is controlled by a host computer 100. Dual expander 102 has two expander cores 104, 106. The dual expander 102 has a test port 116 that may comprise a J-tag port, indicated as a transfer data in (TDI) port in FIG. 1. Host computer 100 has a similar output 114 for transferring data into the J-tag port 116 of dual expander 102. In addition, dual expander 102 has a control port 128 (TMS) that provides a control signal to expander cores 104, 106, respectively. Host computer 100 has a similar control port 108 that is connected in parallel with the control ports 128, 132 of dual expander 102. Host computer 100 can control the reading and writing of data in expander cores 104, 106 by providing a control write or control read signal from TMS port 108. Similarly, host 100 has a transmit clock (TCLK) port 110 which transmits a clock signal from the host 100 to transmit clock port 130 connected to expander core 104, and transmit clock port 134 coupled to expander core 106. In this fashion, the clock signals are provided to the expander cores 104, 106. The J-tag port 116 of the dual expander 102 is connected to a J-tag port 120 of expander core 104. Expander core 104 constitutes the first expander core of a dual expander 102. The transmit data out (TDO) port 122 of expander core 104 is connected to the J-tag port (TDI) input port 124 of expander core 106. The transfer data out (TDO) port 126 of expander core 106 is connected to the TDO port 118 of the dual expander 102. TDO port 118 is connected to the TDO port 112 of host computer 100.

Host computer 100 provides various data signals to the dual expander 102 through the TCLK port 110 and TDI port 114 to the J-tag port 116 of the dual expander 102. This data can comprise operational codes for turning on and off expander core 104 and expander core 106. In addition, this data can comprise control bits that can be loaded into expander core 104 or expander core 106 to control the operation of these expander cores. Further, a write command can be supplied to the expander cores 104, 106 through the J-tag port 116 that instructs the expander cores 104, 106 to write data to an internal register in the expander cores. Further, write addresses can be provided through the J-tag port 116 to the expander cores 104, 106 to indicate the location of a register to write the control bits. Also, read addresses can be supplied through the J-tag port to the expander cores 104, 106, as well as the read command to instruct the expander cores to read data from a register located at the read address supplied by the host computer 114 through the J-tag port 116.

As shown in FIG. 1, there is only one test port 116 for the dual expander 102. The first expander core 104 is serially connected to the second expander core 106 through the J-tag ports 122, 124, respectively. The output J-tag port 106 is serially connected to the J-tag output port 118 of the dual expander 102. The output test port 118 of the dual expander 102 is connected to the host computer at port 112 so that the host computer 100 can read the serial data provided by the J-tag test port that is transmitted from the dual expander 102.

In order to effectively read and write data to and from the dual expander 102, illustrated in FIG. 1, one of the expander cores 104, 106 must be placed in bypass mode. Placing one of the expander cores in bypass mode allows the user to control the other expander core. The manner in which this process is performed is explained in more detail below.

Figure 2:
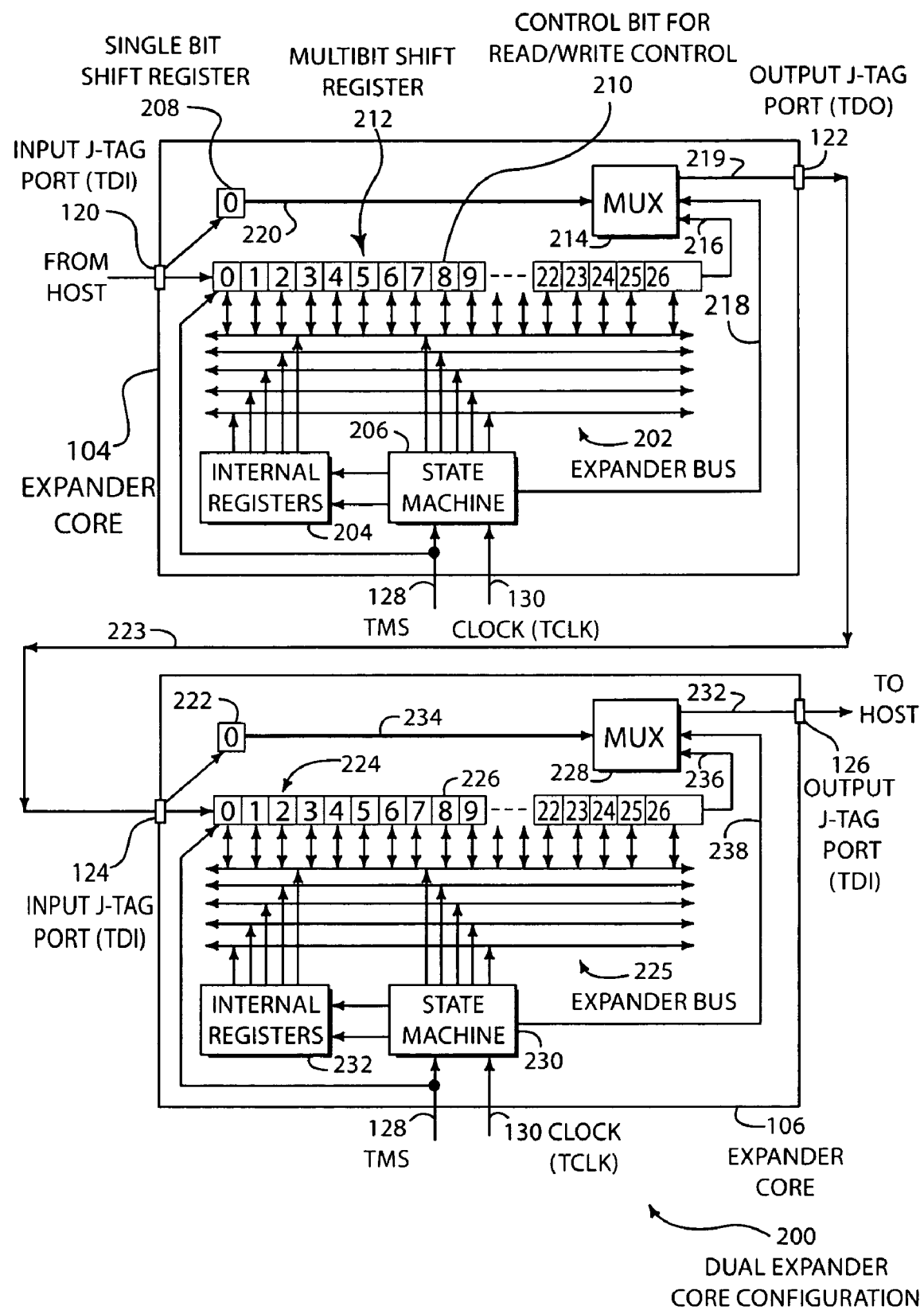
FIG. 2 is a schematic block diagram of a dual expander core configuration.

FIG. 2 is a detailed block diagram of the expander cores 104, 106. As shown in FIG. 2, the input J-tag port (TDI) 120 is connected to a multi-bit serial shift register 212. The size of the serial shift register varies with the type of expander. The serial data from the host is transmitted through the J-tag test port 120 and is clocked into the shift register by clock signal 130 applied to state machine 206. The data is shifted across the shift register 212 with each clock pulse. This process occurs while TMS signal 128 is high. The least significant bits are the lower numbered bits, while the most significant bits are the higher numbered bits. The control bit 210 that controls the read or write operation is located at bit number 8 in shift register 212. As long as TMS input 128 stays high, data will continue to shift through the shift register and out through the output J-tag port (TDO) 122 to the input J-tag port (TDI) 124 of expander core 106. Expander core 106 has a structure that is the same as expander core 104. In this fashion, data can be serially fed from expander core 104, through the shift register 112, into multi-bit shift register 224 located in expander core 106. As long as TMS 128 stay high, and TCLK is running, the data will continue to be shifted to the output J-tag port (TDO) 126 and back to the host. Shifting of the data in expander core 106 occurs in response to the clock signal 130 that is applied to state machine 230. Once TMS 128 goes to a low state, as controlled by the host computer, the data stored in the shift registers 212, 224 is shifted out in parallel to the expander buses 202, 225. The parallel data then forms two bytes that are read by the state machines 206, 230, as well as the read/write control signals 210, 226 that are read by state machines 206, 230. These bytes of data, as explained above, may comprise a control byte for instructing the state machines 206, 230 to perform certain operations, an address byte indicating the location of a particular operation, or an operational byte that can place one of the expander cores 104, 106 in bypass mode. Internal registers 204, 232 are also connected to the expander buses 202, 225, respectively. Internal registers 204, 232 may store data that is used to operate expanders 104, 106, respectively, i.e., the performance of various operations such as adjusting the slew rate, delay time, etc.

When an operational code is entered into an expander core, the operational code functions to instruct one of the expander cores 104, 106 to go into bypass mode. When an expander core goes into a bypass mode, it operates as a single bit shift register 208, 222. By placing one of the cores in bypass mode, data can be loaded into the other core to perform a desired operation, such as reading data from one of the internal registers 204, 232 to determine the settings of the expander cores, or writing new data to one of the expander cores to change the operation of the expander cores. However, when one of the expander cores 104, 106 is placed in bypass mode, it will function as a single bit shift register 208, 222, and dummy bits must be provided at the proper time in the sequence of bits to ensure that data is properly loaded into the expander core that is not in the bypass mode. For example, if the second core 106 is placed in bypass mode, an initial dummy bit must be supplied to expander core 104. When expander core 104 is placed in bypass mode, a dummy bit must follow the data supplied to expander core 106. As also shown in FIG. 2, a multiplexer 214 and expander core 104 generates an output 219 that is applied to the output J-tag port (TDO) 122 of expander core 104. The output 219 is selected from one of the inputs 220 or 216 in response to a control signal 218 that is generated by state machine 206. If expander core 104 is placed in bypass mode, the input signal from the input J-tag port 120 is applied to both the single bit shift register 208 and to the multi-bit shift register 212. However, state machine 206 generates a control signal 218 that is applied to multiplexer 214 to select input 220 to shift data out over the output 219 of multiplexer 214.

As also shown in FIG. 2, the data that is shifted out from output J-tag port 122 is transmitted over a conductor 223 to expander core 106. That data is applied, in a similar manner, to both a single bit shift register 222 and a multi-bit shift register 224 of expander core 106. State machine 230 generates a control signal 238 that is applied to multiplexer 228. In response to the control signal 238, multiplexer 228 selects one of the inputs 234, from single bit shift register 222, or input 236 from multi-bit shift register 224. The selected input signal is then transmitted on the output 232 of multiplexer 228 to output J-tag port 126. The output signal is then transmitted to the host.

Figure 3:
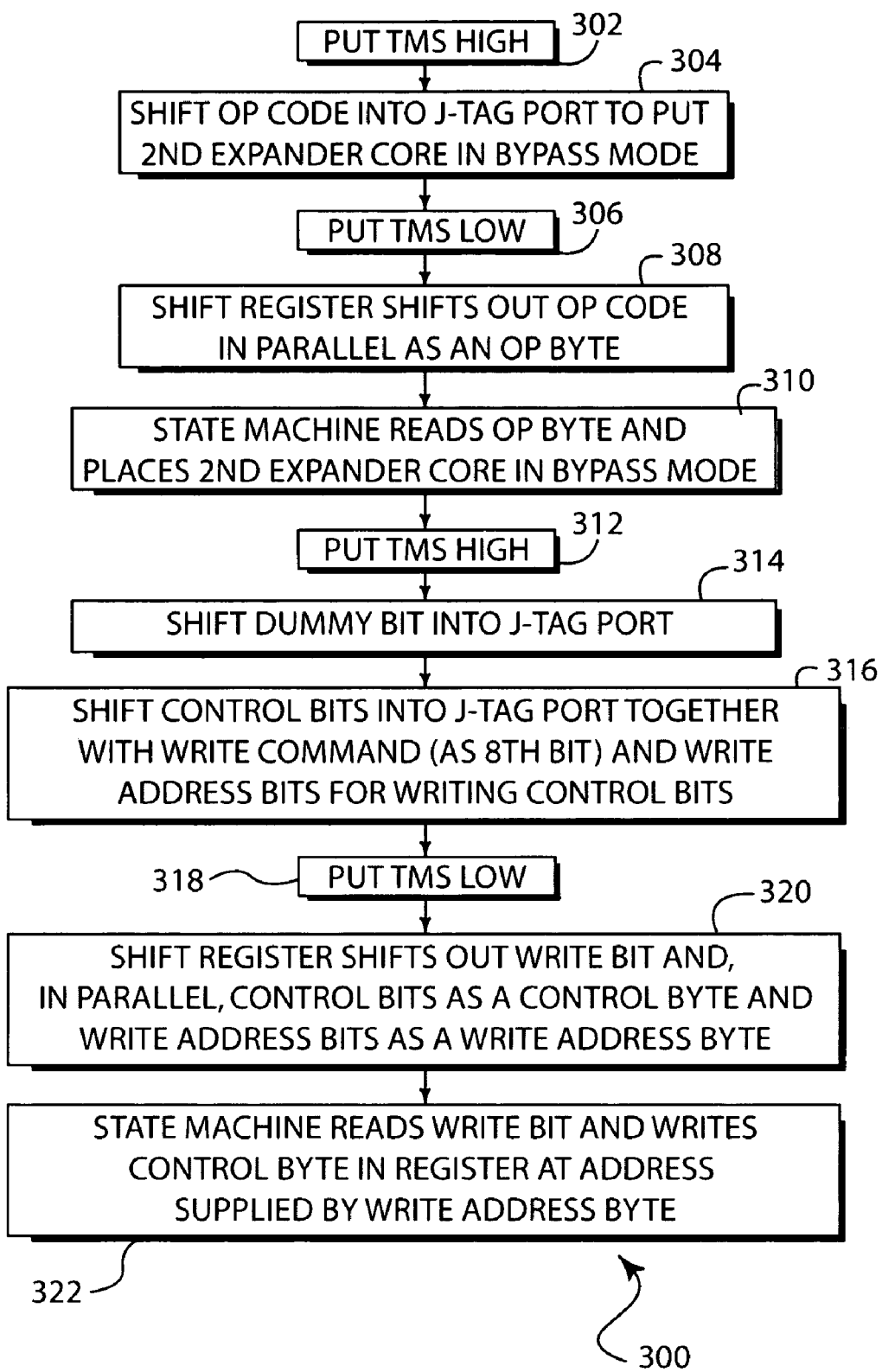
FIG. 3 is a flow diagram illustrating a process for performing a register write operation to a first expander core.

FIG. 3 is a flow diagram illustrating a process for performing a register write operation to the first expander core 104. At step 302, TMS is controlled by the host computer to go high. Operational codes are then serially shifted into the J-tag test port of the expander core for the purpose of placing the second expander core 106 in bypass mode at step 304. At step 306, TMS is driven low by the host computer 100. At step 308, the shift register shifts out the operational code in parallel to form an operational byte that is loaded onto the expander bus in expander core 106 (FIG. 2). At step 310, a state machine in expander core 106 reads the operational byte and places the second expander core in bypass mode. Host computer 100 then drives TMS high at step 312. At step 314, a dummy bit is provided by the host computer and shifted into the J-tag port. At step 316, the host computer then serially shifts control bits into the J-tag port together with a write command (as the eighth bit) and write address bits that indicate an address for writing the control bits. The control bits, again, are bits that control the operation of the expander. Host computer 100 then drives TMS low at step 318. At step 320, the shift register shifts out the write bit into the expander bus in expander core 106 and shifts the control bits into the expander bus in expander core 106 as a control byte. The write address bits are also shifted out in parallel to the expander bus in expander core 106 as a write address byte. At step 322, a state machine located in expander core 106 reads the write bit and writes the control byte in an internal register at the address supplied by the write address byte.

Figure 4:
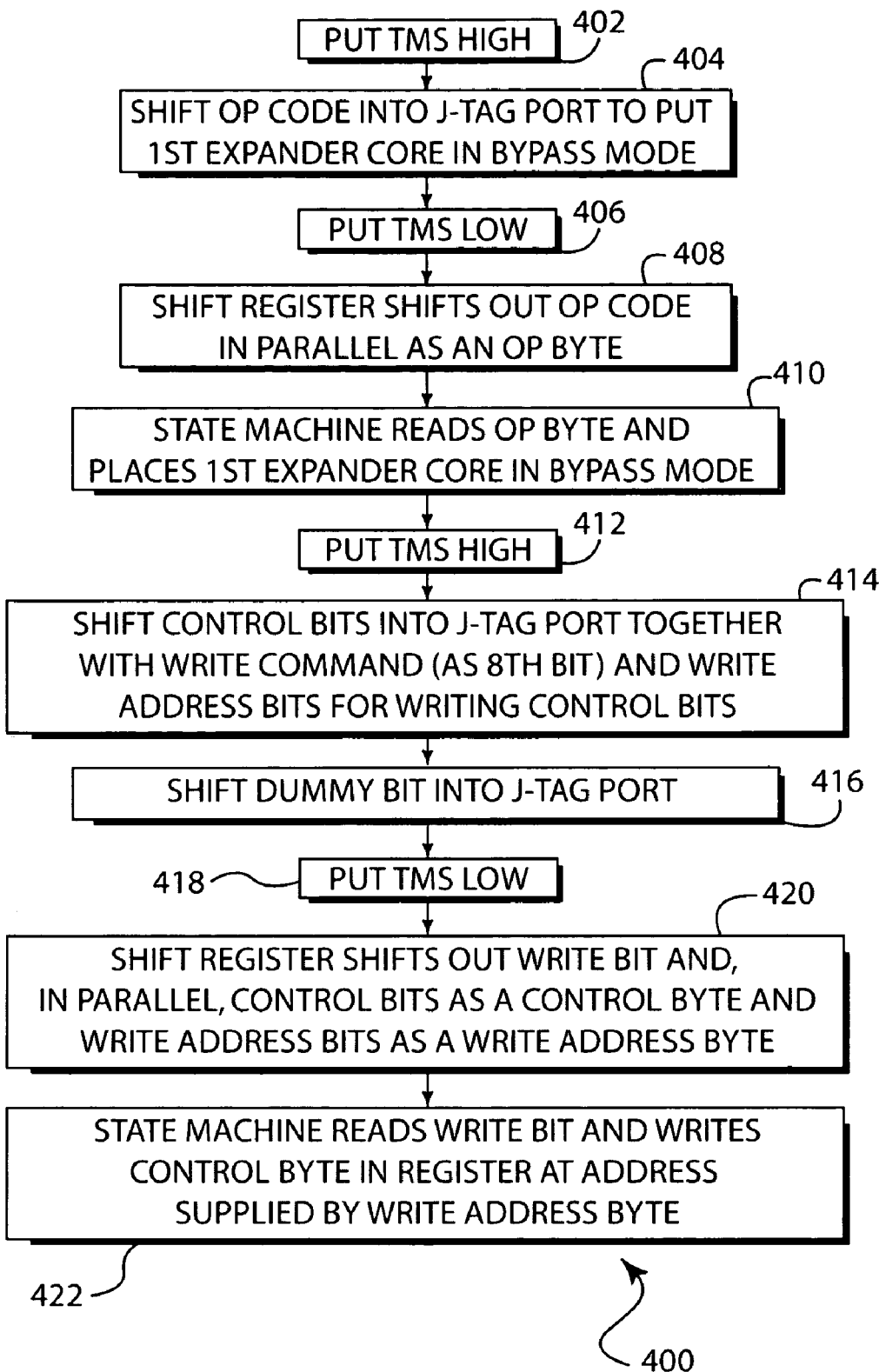
FIG. 4 is a flow diagram illustrating a process for performing a register write operation to a second expander core.

FIG. 4 is a flow diagram illustrating a process for performing a register write operation to the second expander core 106. At step 402, host computer drives TMS high. At step 404, operational code is shifted into the J-tag port 116 of the dual expander port 102 for the purpose of putting the first expander core 104 in bypass mode. At step 406, host computer 100 drives TMS low. At step 408, the shift register 212 shifts out the operational code in parallel as an operational byte to the expander bus 202. At step 410, the state machine 206 reads the operational byte and places the first expander core 104 in bypass mode. At step 412, TMS is then driven high by the host computer 100. At step 414, control bits for controlling the operation of the second expander core 106 are serially shifted into the J-tag port 116 of dual expanders 102. In addition, a write command (as the eighth bit) is shifted into the J-tag port together with the write address bits that indicate the register location for writing the control bits. At step 416, a dummy bit is shifted into the J-tag port. At step 418, TMS is driven low by the host computer 100. At step 420, the shift register shifts out the write bit to the expander bus 202 together with the control bits and the write address bits. The control bits form a control byte, and the write address bits form a write address byte. At step 422, the state machine 206 reads the write bit and writes the control byte to register 204 at the address supplied by the write address byte.

Figure 5:
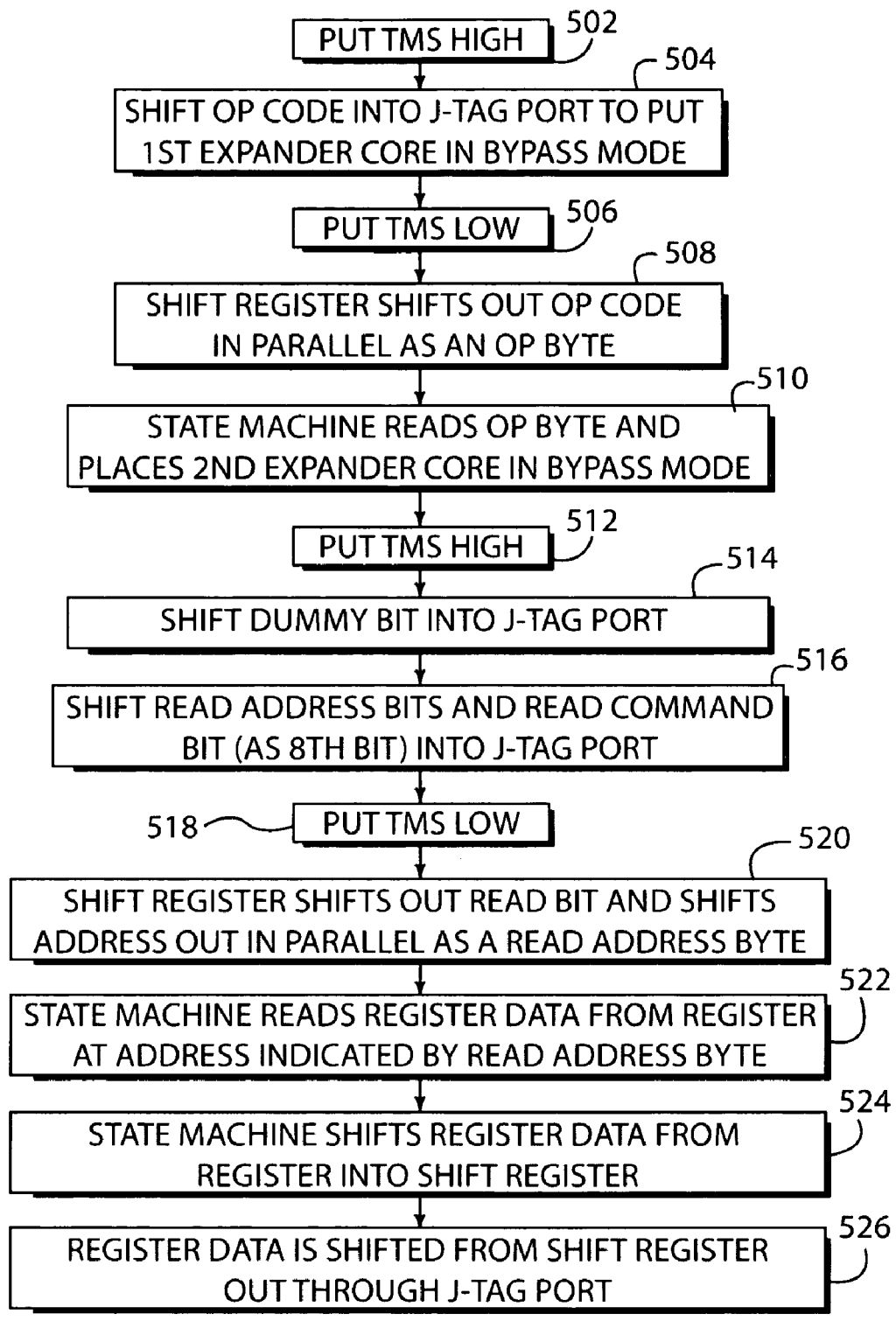
FIG. 5 is a flow diagram illustrating a process for performing a register read operation from a first expander core.

FIG. 5 is a flow diagram illustrating a process for performing a register read operation from the first expander core 104. At step 502, the host computer drives TMS high. At step 504, an operational code is serially shifted into the J-tag port 116 of the dual expander 102 for purpose of placing the first expander core 104 in bypass mode. At step 506, TMS is driven low by the host computer 100. At step 508, a shift register in expander core 106 shifts out the operational code in parallel as an operational byte. At step 510, a state machine in expander core 106 reads the operational byte and places the second expander core in bypass mode. At step 512, the host computer drives TMS high. At step 514, the host computer shifts a dummy bit into the J-tag port 116. At step 516, read address bits and a read command bit (as the eighth bit) are serially shifted into the J-tag port 116. At step 518, the host computer drives TMS low. At step 520, the shift register shifts out the read bit to an expander internal bus in expander 106 and shifts the address bits out in parallel to an expander bus in expander core 106 as a read address byte. At step 522, a state machine located in expander core 106, reads the register data from register in expander core 106 at the address indicated by the read address byte. At step 524, a state machine located in expander core 106 shifts the register data from the register indicated by the read address byte into the shift register located in expander core 106. The register data is then shifted out serially from the shift register to the J-tag output core 126 to the host computer at step 526.

Figure 6:
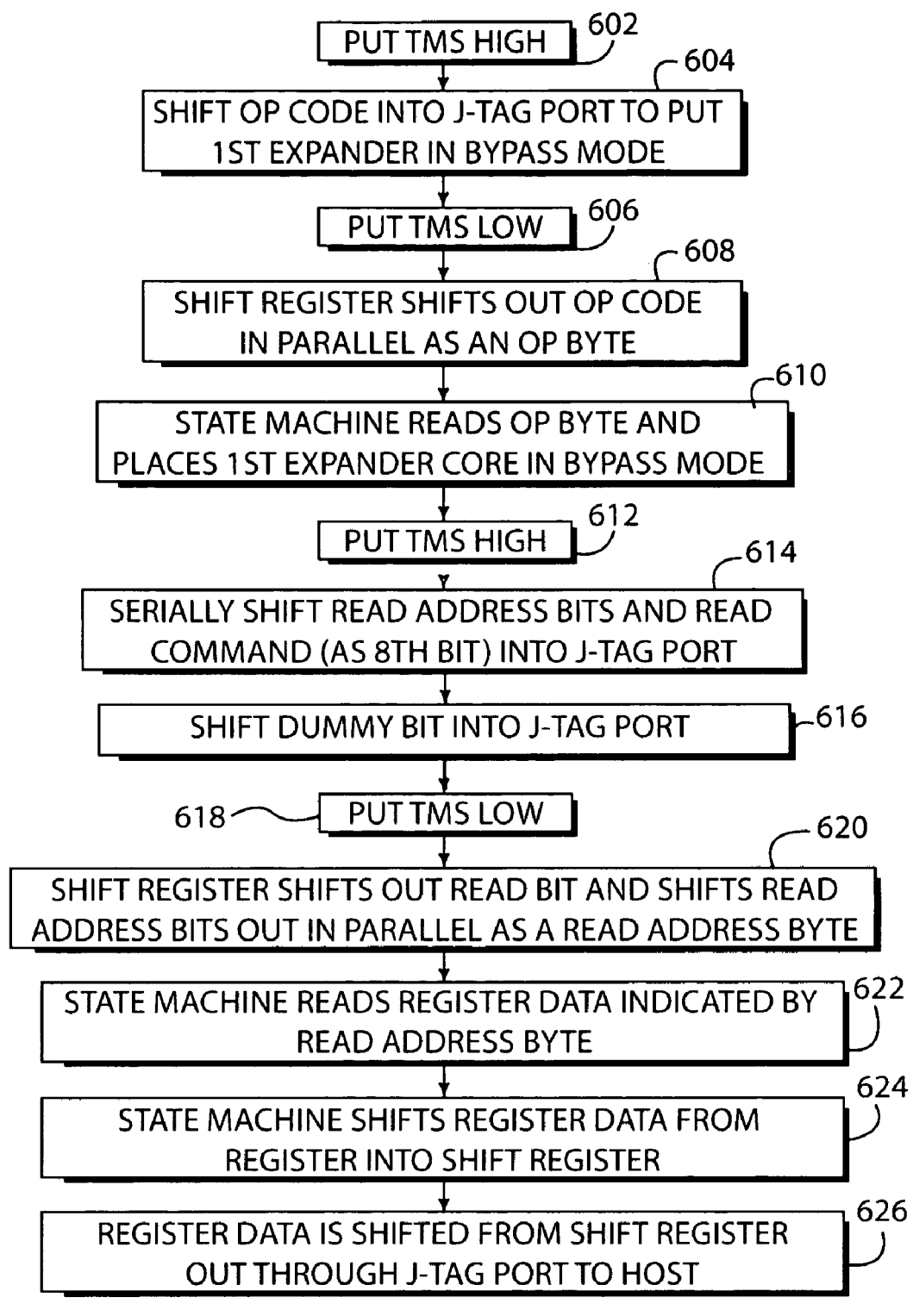
FIG. 6 is a flow diagram illustrating a process for performing a register read operation from a second expander core.

FIG. 6 is a flow diagram illustrating a process for performing a register read operation from the second expander core 106. At step 602, the host computer 100 drives TMS high. At step 604, operational codes are serially shifted into the J-tag port 116 for the purpose of putting the first expander 104 in bypass mode. At step 606, the host computer 100 drives TMS low. At step 608, shift register 212 shifts out the operational code in parallel in expander core 104 to form an operational byte. At step 610, the state machine 204 places the first expander core 104 in bypass mode in response to the operational byte. At step 612, the host computer 100 drives TMS high to allow the shifting of additional data through the J-tag port. At step 614, host computer 100 serially shifts read address bits in the J-tag port 116 and a read command bit (which is the eighth bit) through the J-tag port 116. The first expander core is in bypass mode and operates as a single bit shift register. The data is shifted through the first expander core 104 into the second expander core 106 through the serial J-tag ports. At step 616, a dummy bit is transmitted through the J-tag port which resides in the first expander core 104 in bypass mode. At step 618, TMS is driven low. At step 620, the shift register in expander core 106 shifts out the read bit (as the eighth bit) and shifts the read address bits in parallel to an expander bus in expander 106 to form a read address byte. At step 622, a state machine in expander 106 reads the register data in a register in expander core 106 that is indicated by the read address byte. At step 624, a state machine in expander 106 shifts the register data from the register in expander 106 into the shift register in parallel. At step 626, the register data is then serially shifted from the shift register out through the J-tag port to the host.

Hence, control of a dual expander can be accomplished to both write and read data to and from internal registers in either of the expander cores using a single test port, such as a J-tag port. Access to, and control of, each of the expander cores in the dual expander is accomplished by placing one of the expander cores in bypass mode. Since the expander core in bypass mode functions as a one-bit serial shift register, dummy bytes must be provided to ensure correct data is provided to the internal shift registers of the expander cores. The necessity for removing and reprogramming EPROMs has been eliminated and the host 100 can provide complete control of each expander core in a dual expander in a simple and easy fashion.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A process for controlling a multiple core expander comprising:

using a test port of said multiple core expander to receive both data values as well as instructional and operational codes including a dummy bit from a host computer into a multi-bit shift register and a single bit shift register to said multiple core expander to put all but one core expander of said multiple core expander in bypass mode;

decoding said instructional and operational input codes by a state machine of said one core expander not placed in bypass mode;

serially reading data from, and serially writing data to, at least one internal register of said one core expander not placed in bypass mode by said state machine;

transmitting a control signal from said state machine to a multiplexer to shift data to an output port of said one core expander not placed in bypass mode to either a series connected core expander or back to said host computer; and connecting internal registers to an expander bus wherein said internal registers store data that is used to operate said multiple core expander in order to perform various operations.

2. A method of controlling operation of a dual expander having a first expander core and a second expander core by reading and writing control bits through a single test port in said dual expander comprising:

placing one of said first expander core and said second expander core into bypass mode utilizing a single bit shift register;

transmitting a serial data stream of said control bits as data values and instructional and operational codes through said test port to a shift register to generate a control byte for the expander core that is not in bypass mode;

parallel shifting said control byte from said shift register to a single bit shift register into said one of said first expander core and said second expander core that is not in bypass mode;

providing dummy bits in said serial data stream to correctly form said control byte for said one of said first expander core and said second expander core that is not in bypass mode; and connecting internal registers to an expander bus wherein said internal registers store data that is used to operate said dual expander in order to perform various operations.

3. A process for performing a register write operation in a first expander core of a dual expander comprising:

serially shifting operational code bits into a test port, said operational code bits including data plus instructions with a dummy bit from a host computer into a multi-bit shift register and a single bit shift register to place a second expander core, in said dual expander, into bypass mode;

generating an operational byte from said operational code bits;

placing said second expander core into bypass mode in response to said operational byte;

serially shifting control data bits, address bits and write command bits of said operational code bits into said test port;

reading said serially shifted control data bits, address bits and write command bits by a state machine;

generating a control byte by said state machine from said control data bits and an address byte from said address bits;

writing said control byte by said state machine to a register in said first expander core at an address indicated by said address byte; and connecting internal registers to an expander bus wherein said internal registers store data that is used to operate said dual expander in order to perform various operations.

4. A process for performing a register write operation in a second expander core of a dual expander comprising:

serially shifting operational code bits into a test port of said dual expander, said operational code bits including data plus instructions with a dummy bit from a host computer into a multi-bit shift register and a single bit shift register to place the first expander core, in said dual expander, into bypass mode utilizing a single bit shift register;

generating an operational byte from said operational code bits;

placing said first expander core into bypass mode in response to said operational byte;

shifting control data bits, address bits and write command bits into said test port;

reading said serially shifted control data bits, address bits and write command bits by a state machine;

generating a control byte by said state machine from said control data bits and an address byte from said address bits;

writing said control byte by said state machine to a register in said second expander core at an address indicated by said address byte; and connecting internal registers to an expander bus wherein said internal registers store data that is used to operate said dual expander in order to perform various operations.

5. A process for performing a register read operation from a first expander core of a dual expander comprising:

serially shifting operational code bits into a test port of said dual expander, said operational code bits including data plus instructions with a dummy bit from a host computer into a multi-bit shift register and a single bit shift register to place the second expander, in said dual expander, into bypass mode;

generating an operational byte from said operational code bits;

placing said second expander core into bypass mode in response to said operational byte;

serially shifting read address bits and a read command into said test port of said dual expander;

generating an address byte by a state machine from said read address bits;

serially reading data by said state machine from a register in said first expander core at an address indicated by said address byte through said test port of said dual expander; and connecting internal registers to an expander bus wherein said internal registers store data that is used to operate said dual expander in order to perform various operations.

6. A process for performing a register read operation from a second expander core of a dual expander comprising:

serially shifting operational code bits into a test port of said dual expander, said operational code bits including data plus instructions with a dummy bit from a host computer into a multi-bit shift register and a single bit shift register to place the first expander, in said dual expander, into bypass mode;

generating an operational byte from said operational code bits;

placing said first expander core into bypass mode in response to said operational byte;

serially shifting read address bits and a read command into a test port of said dual expander;

generating a read address byte by a state machine from said read address bits;

serially reading data by said state machine from a register in said second expander core at an address indicated by said address byte through said test port of said dual expander; and connecting internal registers to an expander bus wherein said internal registers store data that is used to operate said dual expander in order to perform various operations.

7. The process for controlling said multiple core expander of claim 1 wherein said various operations comprise at least one of the group comprising: adjusting slew rate and adjusting delay time.

8. The method of controlling operation of said dual expander having said first expander core and said second expander core of claim 2 wherein said various operations comprise at least one of the group comprising: adjusting slew rate and adjusting delay time.

9. The process for performing said register write operation in said first expander core of said dual expander of claim 3 wherein said various operations comprise at least one of the group comprising: adjusting slew rate and adjusting delay time.

10. The process for performing said register write operation in said second expander core of said dual expander of claim 4 wherein said various operations comprise at least one of the group comprising: adjusting slew rate and adjusting delay time.

11. The process for performing said register read operation from said first expander core of said dual expander of claim 5 wherein said various operations comprise at least one of the group comprising: adjusting slew rate and adjusting delay time.

12. The process for performing said register read operation from said second expander core of said dual expander of claim 6 wherein said various operations comprise at least one of the group comprising: adjusting slew rate and adjusting delay time.

13. The process for performing a register read operation from a first expander core of a dual expander of claim 1 wherein said multi-core expander does not require that EPROM contained in said multi-core expander does not need to be removed and reprogrammed.

14. The method of controlling operation of said dual expander having said first expander core and said second expander core of claim 2 wherein said dual expander does not require that EPROM contained in said multi-core expander does not need to be removed and reprogrammed.

15. The process for performing said register write operation in said first expander core of said dual expander of claim 3 wherein said dual expander does not require that EPROM contained in said multi-core expander does not need to be removed and reprogrammed.

16. The process for performing said register write operation in said second expander core of said dual expander of claim 4 wherein said dual expander does not require that EPROM contained in said multi-core expander does not need to be removed and reprogrammed.

17. The process for performing said register read operation from said first expander core of said dual expander of claim 5 wherein said dual expander does not require that EPROM contained in said multi-core expander does not need to be removed and reprogrammed.

18. The process for performing said register read operation from said second expander core of said dual expander of claim 6 said dual expander does not require that EPROM contained in said multi-core expander does not need to be removed and reprogrammed.

\* \* \* \* \*